US008836835B2

(12) United States Patent
Adkisson et al.

(10) Patent No.: US 8,836,835 B2
(45) Date of Patent: Sep. 16, 2014

(54) PIXEL SENSOR CELL WITH HOLD NODE FOR LEAKAGE CANCELLATION AND METHODS OF MANUFACTURE AND DESIGN STRUCTURE

(75) Inventors: James W. Adkisson, Jericho, VT (US); John J. Ellis-Monaghan, Grand Isle, VT (US); Richard J. Rassel, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 513 days.

(21) Appl. No.: 12/897,295

(22) Filed: Oct. 4, 2010

(65) Prior Publication Data

US 2012/0081588 A1 Apr. 5, 2012

(51) Int. Cl.
*H04N 5/335* (2011.01)
*H04N 5/359* (2011.01)
*H01L 27/146* (2006.01)
*H04N 5/3745* (2011.01)

(52) U.S. Cl.
CPC ......... *H01L 27/14609* (2013.01); *H04N 5/359* (2013.01); *H01L 27/14603* (2013.01); *H04N 5/3745* (2013.01)
USPC ...................................................... 348/308

(58) Field of Classification Search
USPC ................ 348/245, 241, 243, 294, 296, 308; 250/208.1
See application file for complete search history.

(56) References Cited

U.S. PATENT DOCUMENTS

| 5,565,915 A | 10/1996 | Kindo et al. |
| 5,654,755 A | 8/1997 | Hosier |
| 6,201,572 B1 | 3/2001 | Chou |
| 6,344,877 B1 | 2/2002 | Gowda et al. |
| 6,476,864 B1 * | 11/2002 | Borg et al. ............... 348/245 |
| 6,580,454 B1 | 6/2003 | Perner et al. |
| 6,744,526 B2 | 6/2004 | McDermott et al. |
| 6,911,640 B1 * | 6/2005 | Bencuya et al. ............ 348/308 |
| 7,084,912 B2 | 8/2006 | Chieh |
| 7,375,748 B2 | 5/2008 | Krymski |
| 8,023,021 B2 | 9/2011 | Adkisson et al. |
| 8,077,240 B2 | 12/2011 | Ellis-Monaghan et al. |
| 2004/0051802 A1 * | 3/2004 | Krymski .................. 348/308 |
| 2006/0076679 A1 | 4/2006 | Batchelor et al. |
| 2006/0192864 A1 * | 8/2006 | Mauritzson ............... 348/241 |
| 2008/0099805 A1 | 5/2008 | Abadeer et al. |

(Continued)

FOREIGN PATENT DOCUMENTS

WO 2012047509 A2 4/2012

OTHER PUBLICATIONS

International Search Report of the International Searching Authority for Appl. No. PCT/US2011/052436, date of mailing Apr. 10, 2012.

(Continued)

*Primary Examiner* — Aung S Moe
(74) *Attorney, Agent, or Firm* — Anthony Canale; Roberts Mlotkowski Safran & Cole, P.C.

(57) ABSTRACT

A reference pixel sensor cell (e.g., global shutter) with hold node for leakage cancellation, methods of manufacture and design structure is provided. A pixel array includes one or more reference pixel sensor cells dispersed locally throughout active light sensing regions. The one or more reference pixel sensor cells provides a reference signal used to correct for photon generated leakage signals which vary by locality within the active light sensing regions.

21 Claims, 5 Drawing Sheets

(56) References Cited

U.S. PATENT DOCUMENTS

| | | | |
|---|---|---|---|
| 2008/0237450 A1* | 10/2008 | Abadeer | 250/208.1 |
| 2009/0174084 A1 | 7/2009 | Jadhav et al. | |
| 2009/0190005 A1* | 7/2009 | Mo et al. | 348/241 |
| 2009/0201393 A1* | 8/2009 | Tai et al. | 348/243 |
| 2009/0236644 A1* | 9/2009 | Adkisson et al. | 348/308 |
| 2009/0268063 A1 | 10/2009 | Ellis-Monaghan et al. | |
| 2009/0273691 A1* | 11/2009 | Mo et al. | 348/302 |
| 2009/0303366 A1* | 12/2009 | Gambino et al. | 348/308 |
| 2009/0305499 A1* | 12/2009 | Gambino et al. | 438/637 |
| 2010/0097511 A1 | 4/2010 | Adkisson et al. | |
| 2010/0128148 A1 | 5/2010 | Yamauchi | |

OTHER PUBLICATIONS

Written Opinion of the International Searching Authority for Appl. No. PCT/US2011/052436, date of mailing Apr. 10, 2012.

AY, "Photodiode Peripheral Utilization Effect on . . . Performance", IEEE Transactions onCicuits and Systems—I: Regular Papers, vol. 55, No. 6, Jul. 2008, pp. 1405-1411.

Examination Report under Section 18 (3) for the UK Appl. No. GB1307298.8 dated Mar. 13, 2014, 3 pages.

Response to Examination Report under Section 18 (3) for the UK Appl. No. GB1307298.8 May 7, 2014, 15 pages.

* cited by examiner

| 5' | 5 | 5 |
|---|---|---|
| 5 | 5' | 5 |
| 5 | 5 | 5' |

PIXEL SENSOR CELL WITH HOLD NODE FOR LEAKAGE CANCELLATION AND METHODS OF MANUFACTURE AND DESIGN STRUCTURE

FIELD OF THE INVENTION

The invention relates to semiconductor structures and methods of manufacture and, more particularly, to a reference pixel sensor cell (e.g., global shutter) with hold node for leakage cancellation, methods of manufacture and design structure.

BACKGROUND

Images in CMOS image sensors are captured using a rolling shutter methodology. In rolling shutter operation, the image is captured on a row-by-row basis, where for a given row the image is captured in its light conversion unit, transferred to a floating diffusion node, and then read out of the pixels to column sample circuits before moving on to the next row. This repeats until the all the rows are captured and read out sequentially or in some other sequence. In this methodology, each row captured actually represents the subject (image) at a different time. Thus, for highly dynamic subjects (e.g., such as objects moving at a high rate of speed) the rolling shutter methodology can create image artifacts.

A global shutter methodology is used to solve this image artifact issue of capturing high speed objects. For a global shutter operation, the image is captured for the whole frame in the light conversion units of the pixels at the exact same time for all the rows and columns. The signal is then transferred to the floating diffusion (FD) node where it waits until it is read out of the imager array on a row-by-row basis. The global shutter method solves the problem with image capture of high speed subjects, but introduces a concern with the global shutter efficiency of the pixel.

In the rolling shutter method, the image signal is held onto the floating diffusion for a significantly shorter time than the actual time of exposure in the light conversion unit, e.g. photodiode. Thus, the contribution of the generation rate of the floating diffusion is orders of magnitude smaller than the generation rate during the integration time in the light conversion structure, e.g. photodiode. This hold time on the floating diffusion is constant for all pixels in the imager array.

But for the global shutter method, the image signal is held onto the floating diffusion for varying amounts of time, with the first row only waiting for the time to read out a single row, while the last row signal waits on the floating diffusion for the full frame read-out time. Thus, any generations or leakage occurring on the floating diffusion node can have a significant impact to the signal being read out of the imager. The global shutter efficiency of the pixel is determined by the ratio signal read out of the pixel versus the initial signal captured by the pixel. Ideally the signal read out would be exactly the signal captured.

In order to improve on the global shutter efficiency it is necessary to reduce the amount of change to the signal being held on the floating diffusion. Various phenomenon can impact this efficiency, such as photon generated carriers being collected in the floating diffusion, floating diffusion junction leakage to substrate, and floating diffusion leakage through the reset gate (RG) to Vdd node.

Even with all the available process variations and additions to minimize the leakage on the floating diffusion, there may always be some level of photon induced leakage occurring on the floating diffusion node and therefore global shutter efficiency may never be 100%. Accordingly, there exists a need in the art to overcome the deficiencies and limitations described hereinabove.

SUMMARY

In a first aspect of the invention, a pixel array comprises one or more reference pixel sensor cells dispersed locally throughout active light sensing regions. The one or more reference pixel sensor cells provide a reference signal used to correct for photon generated leakage signals which vary by locality within the active light sensing regions.

In another aspect of the invention, a pixel array comprises a reference pixel sensor cell comprising a global shutter gate which is connected to Vdd or a reference voltage line so as to continuously be held in a reset mode so as to not be influenced by photons entering a photodiode of the reference pixel sensor cell.

In yet another aspect of the invention, a method of manufacturing a pixel sensor cell array comprises forming an active pixel sensor cell with a global shutter gate connecting to shutter wiring line. The method further comprises forming a reference pixel sensor cell in proximity to the active pixel sensor cell. The reference pixel sensor cell has a global shutter gate connected to a reference voltage such that it is not influenced by photons entering a photodiode of the reference pixel sensor cell.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of pixel sensor cell (PSC), which comprises the structures of the present invention. In still further embodiments, a method in a computer-aided design system is provided for generating a functional design model of the PSC. The method comprises generating a functional representation of the structural elements of the PSC.

In still another aspect of the invention, a method is provided for compensating for leakage in a pixel array. The method comprises providing a known voltage signal to a reference pixel sensor cell in proximity to an active pixel sensor cell. The method further comprises reading out an output voltage signal of the reference pixel sensor cell and calculating the leakage as a difference between the known voltage signal and the output voltage signal. The method further comprises adding the calculated leakage to an output voltage signal of the active pixel sensor cell.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 3 shows an exemplary layout of active pixel sensor cells and reference pixel sensor cells in accordance with aspects of the invention;

DETAILED DESCRIPTION

The invention relates to semiconductor structures and methods of manufacture and, more particularly, to a reference pixel sensor cell (e.g., global shutter) with hold node for leakage cancellation, methods of manufacture and design structure. More specifically, the present invention relates to a pixel sensor cell array (e.g. global shutter image sensor array) comprising at least one reference pixel sensor cell located adjacent to at least one active pixel sensor cell. In embodiments, the reference pixel sensor cell differs from the active pixel sensor cell by holding the reference pixel sensor cell in a reset mode so as to not be influenced by photons entering the photodiode.

Advantageously, the reference pixel sensor cell provides a reference signal which may be used to correct for photon generated leakage signals which can vary by locality within the active light sensing regions. For example, the reference pixel sensor cell can provide a known (e.g., representative/accurate) reference signal, which can be used to determine any leakage by subtracting the output signal (read-out) from the reference signal. This difference can then be used to compensate for any losses of the active pixel sensor cells due to photon generated leakage value occurring on the floating/hold diffusion of a global shutter pixel. Accordingly, by using the reference pixel sensor cell values it is possible to correct locally for the photon generated leakage in the active image sensors used for image capture.

In embodiments, the reference pixel sensor cell is adjacent to one or more active pixel sensor cells and, in embodiments, can be surrounded by a plurality of active pixel sensor cells. In further embodiments, the present invention contemplates using a paired unit cell where one pixel has the active image sensor and another acts as the reference pixel sensor cell (e.g., floating/hold diffusion reference sensor) used for correction. In any scenario of the present invention, due to the close proximity of the reference pixel sensor cell to local (adjacent) active pixel sensor cells, the reference pixel sensor cell receives the same impinging electromagnetic radiation (e.g. light) at the same time as the nearby active pixel sensor cells. This allows the reference pixel sensor cell to provide a representative/accurate reference signal as described herein.

Figure 1:
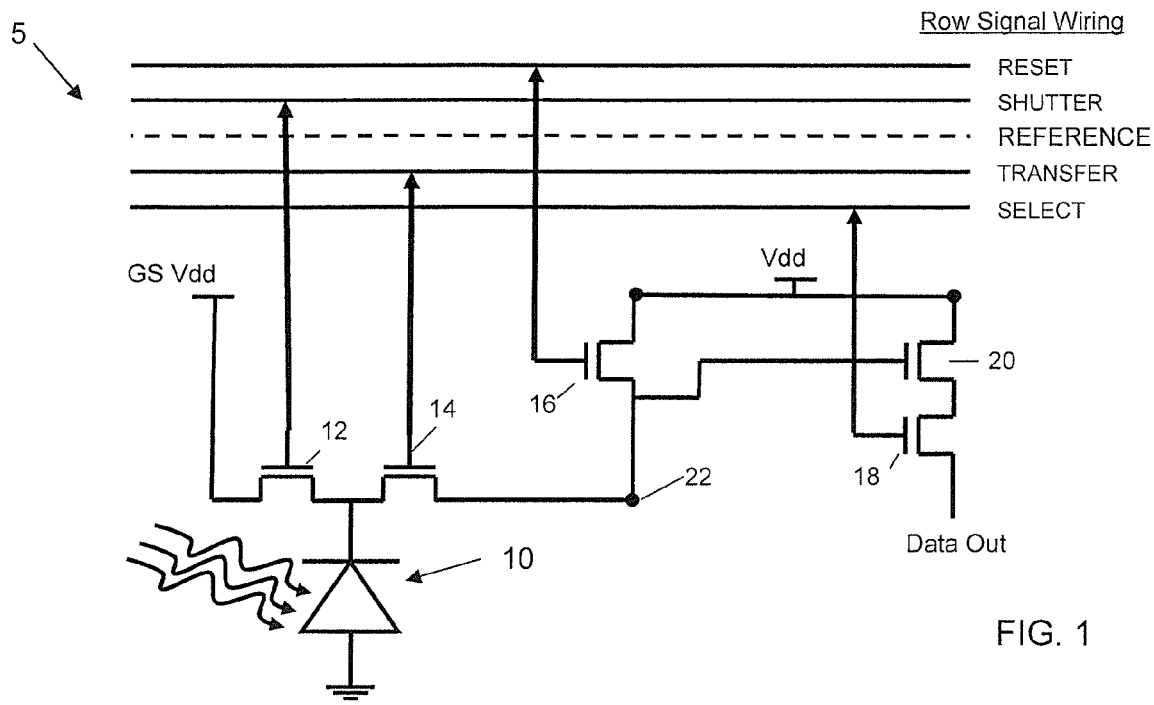
FIG. 1 shows an exemplary circuit diagram of an active pixel sensor cell in accordance with aspects of the present invention.

FIG. 1 shows an exemplary circuit diagram of an active pixel sensor cell in accordance with aspects of the present invention. The exemplary global shutter active pixel sensor cell is designated as reference numeral 5. In embodiments, the active pixel sensor cell 5 can be, for example, a global shutter "5T" (five transistor) operation in a pixel array; although other operations are also contemplated for use with the present invention such as, for example, a global shutter "7T" operation in a pixel array. Although a single active pixel sensor cell 5 is described, it is understood by those of skill in the art that a plurality of such active pixel sensor cells 5 are provided in a pixel array.

In embodiments, the active pixel sensor cell 5 includes a photodiode 10 (e.g., pinned photodiode) connected between a global shutter gate 12 and a global transfer gate 14. In embodiments, the global shutter gate 12 is connected to "SHUTTER" row signal wiring and the global transfer gate 14 is connected to "TRANSFER" row signal wiring. A reset gate 16 is connected to "RESET" row signal wiring, and a row select gate 18 is connected to "SELECT" row signal wiring. Additionally, a source follower gate 20 is connected to a floating diffusion node 22. The active pixel sensor cell 5 also includes Vdd and data read-out.

In operation, each photodiode 10 of each active pixel sensor cell 5 is globally reset by toggling the high signal for the respective global shutter gate 12 to start the integration time, t-int. After some t-int, the floating diffusion node 22 for each active pixel sensor cell 5 globally resets by toggling the high signal of the reset gate 16. Then, the high signal for each global transfer gate 14 of each active pixel sensor cell 5 is globally toggled to transfer the photodiode signal to its respective floating diffusion node 22 for each active pixel sensor cell 5. The high signal for each global shutter gate 12 is held for each photodiode blooming protection during read-out. Then, row by row read-out of each pixel array is provided with holding the high signal of the row for the row select gate 18 for the collected photodiode signal, followed by toggling the high signal of the row for the reset gate 16 for a pixel reset reference level.

In operation, image degradation becomes a significant issue due to leakage. Illustratively, image degradation can occur due to different read-out times. For example, the photodiode t-int can be as low as 50 us, while the full frame read-out can take up to 50 ms or more. As such, the captured photodiode signal can sit on the floating diffusion node 22 approximately 1000 times longer than it took to collect the signal, leading to image degradation. Also, it is well known that each row has an increasing hold time and more signal degradation leading to image degradation for each read-out in subsequent rows. Also, the holding signal on the floating diffusion node 20 is susceptible to electrical leakages from a variety of sources such as, for example, shutter hold node electrical leakage sources such as:

- generation leakage due to Si surfaces and shallow trench isolation structures,
- leakage to lower potential nodes through the global transfer gate 14 to the photodiode 10,
- leakage to higher potential nodes through the reset gate 16 to Vdd, and/or
- deep photon generated leakage resulting from deep generated carriers being collected by the hold node.

To compensate for leakage and other signal losses on the row, the present invention provides one or more reference pixel sensor cells 5' (see, e.g., FIGS. 2 and 3) in close proximity to the active pixel sensor cells 5. In embodiments, the reference pixel sensor cell 5' is similar to the active pixel sensor cell 5, as discussed in more detail below, to ensure consistent signal characteristics between the reference pixel sensor cell 5' and the active pixel sensor cell 5.

Figure 2:
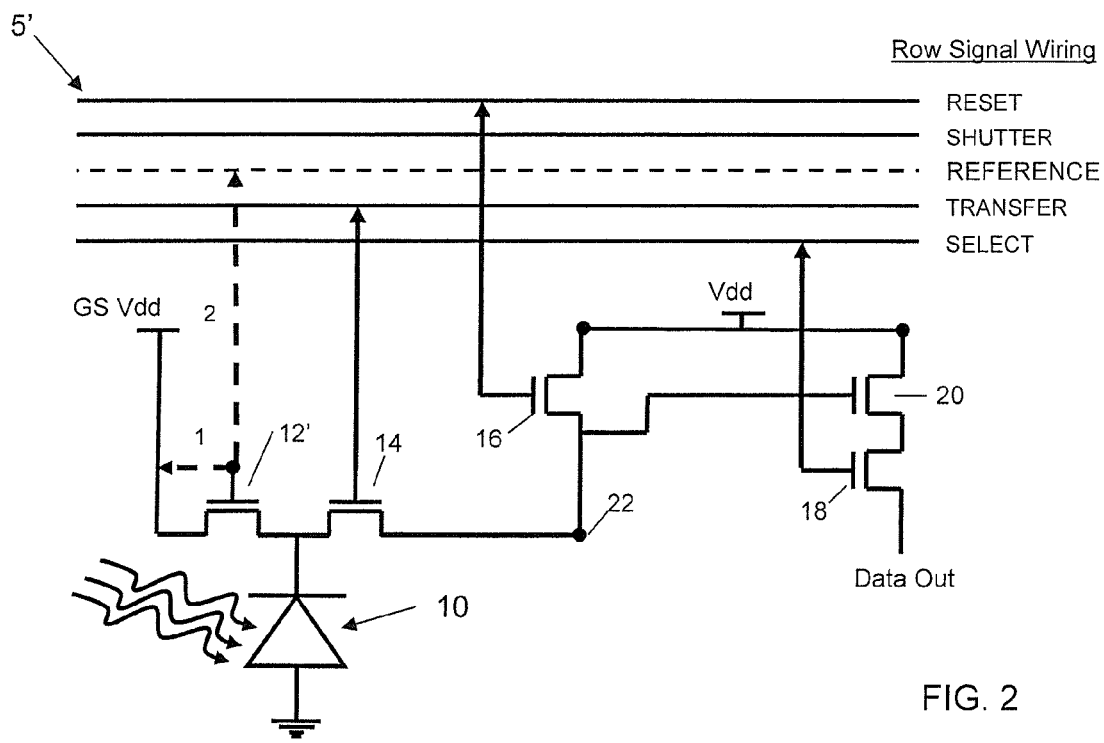
FIG. 2 shows an exemplary circuit diagram of a reference pixel sensor cell in accordance with aspects of the present invention.

FIG. 2 shows an exemplary circuit diagram of a reference pixel sensor cell 5' in accordance with aspects of the invention. In embodiments, the reference pixel sensor cell 5' can be, for example, a global shutter "5T" (five transistor) operation in a pixel array; although other operations are also contemplated for use with the present invention such as, for example, a global shutter "7T" operation in a pixel array. Although a single reference pixel sensor cell 5' is described, it is understood by those of skill in the art that a plurality of such reference pixel sensor cell 5' are provided in a pixel array.

In embodiments, the reference pixel sensor cell 5' includes a photodiode 10 (e.g., pinned photodiode) connected between a global shutter gate 12' and a global transfer gate 14. In embodiments, the global shutter gate 12' is connected to either Vdd (1) or "REFERENCE" row signal wiring (2). In this way, the photodiode 10 can be held at a predetermined level by wiring the global shutter gate 12' high at some predetermined signal level (e.g., set value) during sensor operations (e.g., static value) such that the reference voltage on the floating diffusion node remains at a set value. That is, the global shutter gate 12' can be continuously held in a reset mode, e.g., non-active mode (e.g., the photodiode 10 is kept out of the active state), so that the reference pixel sensor cell 5' will not be influenced by photons entering the photodiode 10, e.g., non-responsive to regular t-int time. Instead, the only contribution to the signal in the reference pixel sensor cell 5' is the parasitic signals of the floating diffusion hold time, regardless of the method of pixel array read-out, e.g., random or sequential order read-out. In embodiments, the global shutter gate Vdd signal can be varied for the reference pixels, to set reset at different levels.

Similar to the active pixel sensor cell 5, the global transfer gate 14 is connected to "TRANSFER" row signal wiring. The reset gate 16 is connected to "RESET" row signal wiring, and the row select gate 18 is connected to "SELECT" row signal wiring. Additionally, the source fill gate 20 is connected to the floating diffusion node 22. The reference pixel sensor cell 5' also includes Vdd and data read-out. As such, the reference pixel sensor cell 5' is similar to the active pixel sensor cell 5 to ensure consistent signal characteristics with the active pixel sensor cell 5.

In operation, the floating diffusion voltages are set at a reference voltage to monitor the floating diffusion leakage during hold time. The signal loss on the one or more reference pixel sensor cells 5' can then be calculated by subtracting the read-out value from the set (known) value during the hold time. The signal loss can then be assumed to be the same for the active pixel sensor cell 5, which has substantially the same signal characteristics of the local reference pixel sensor cells 5'. As the signal loss is assumed to be the same, it is possible to add the signal loss into the read-out value of the active pixel sensor cell 5 to compensate for the degradation of the image in a regular lighting environment, for example.

Figure 3:
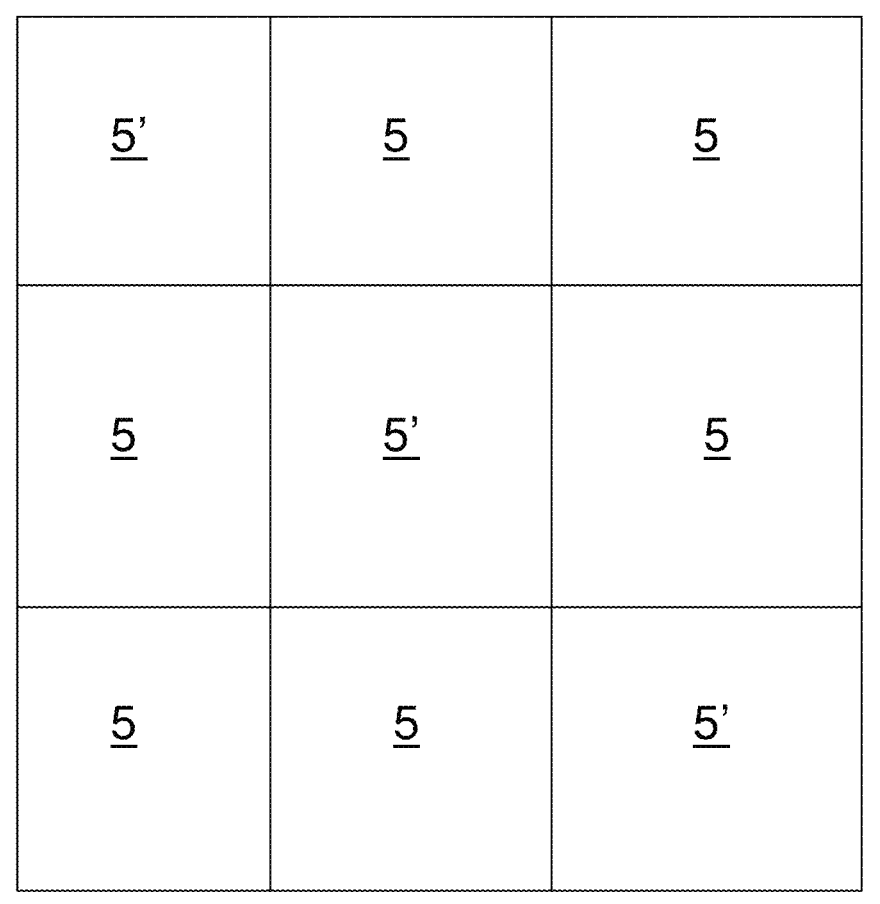

FIG. 3 shows an exemplary layout of active pixel sensor cells and reference pixel sensor cells in accordance with aspects of the invention. In embodiments, the pixel array can include one or more reference pixel sensor cells 5' with the floating diffusion voltages set at a reference voltage to monitor the floating diffusion leakage during hold time. The one or more reference pixel sensor cells 5' can be placed locally to the one or more active pixel sensor cells 5. For example, the reference pixel sensor cells 5' can be paired with the active pixel sensor cells 5. In further embodiments, the active pixel sensor cells 5 can surround each of the reference pixel sensor cells 5'. In still further embodiments, the reference pixel sensor cells 5' can account for about 33% and more specifically about 25% of the pixels in the pixel array. Other combinations are also contemplated by the present invention with the tradeoff of accuracy and resolution.

In embodiments, by placing the reference pixel sensor cells 5' locally in the pixel array, it is now possible to decipher the average local contribution of the photon generated leakages to the hold nodes as the illumination across the pixel array regions can vary. More specifically, in embodiments, when running a pixel sensor cell imager in a global shutter mode, the floating node leakage of the reference pixel sensor cells 5' can be calculated to find the general local floating node leakage across the various hold times waiting for read-out, in the active pixel sensor cells 5. This can be accomplished by interpolating the reference pixel sensor cells 5' contribution to neighboring local pixels in the active pixel sensor cells 5. This reference floating diffusion leakage will have in account all the major components of the floating diffusion leakage including amongst others:

Dark Current Generation, e.g., non-photon generated carrier leakage, and
Photon Current Generation, e.g., photon generated carrier leakage.

There is also provided several dark rows which are measured with the same integration time. These dark rows are subtracted from the completed image so as to reduce the total noise of the observed image. It is also possible to combine with the column and/or row dark reference pixels to compensate the degradation of the signal. This can be performed by, for example, extrapolating the photon generated component of the floating diffusion leakage locally.

Figure 4:
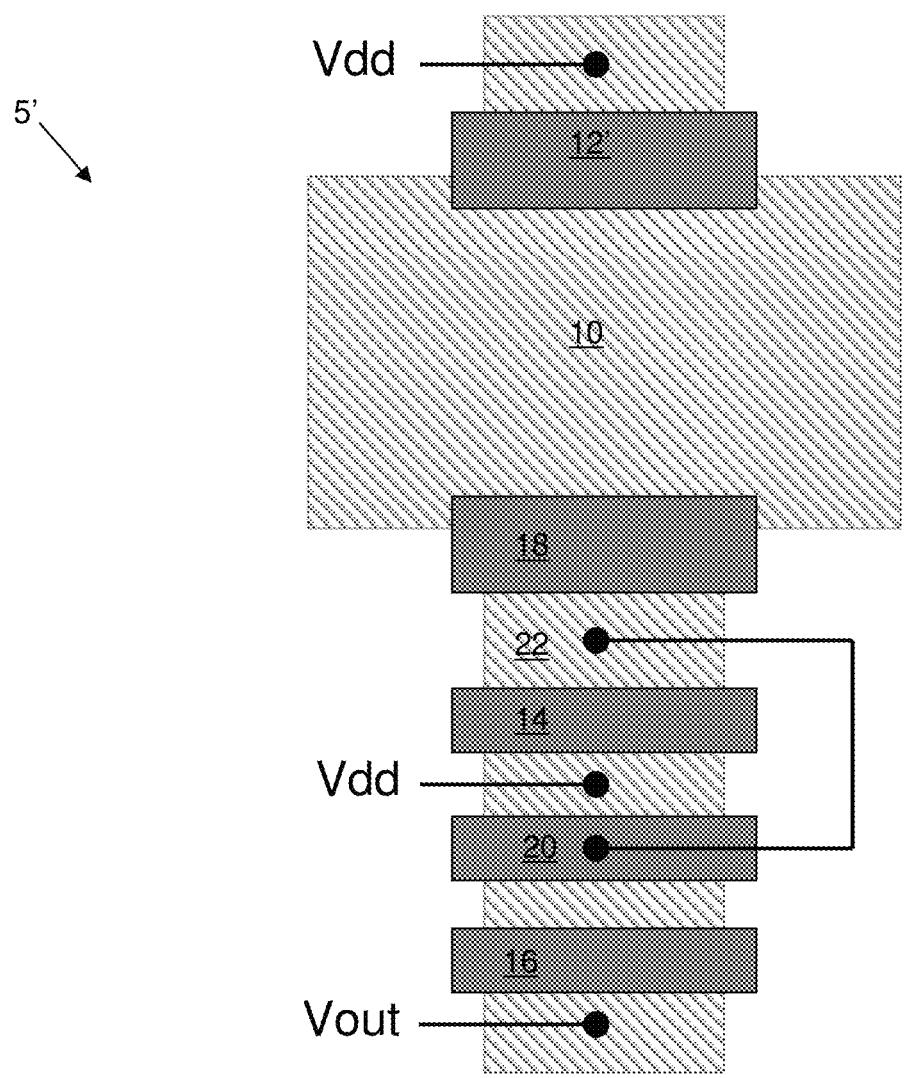
FIG. 4 is a top view of an exemplary reference pixel sensor cell (and respective fabrication steps) in accordance with aspects of the present invention.
Figure 5:
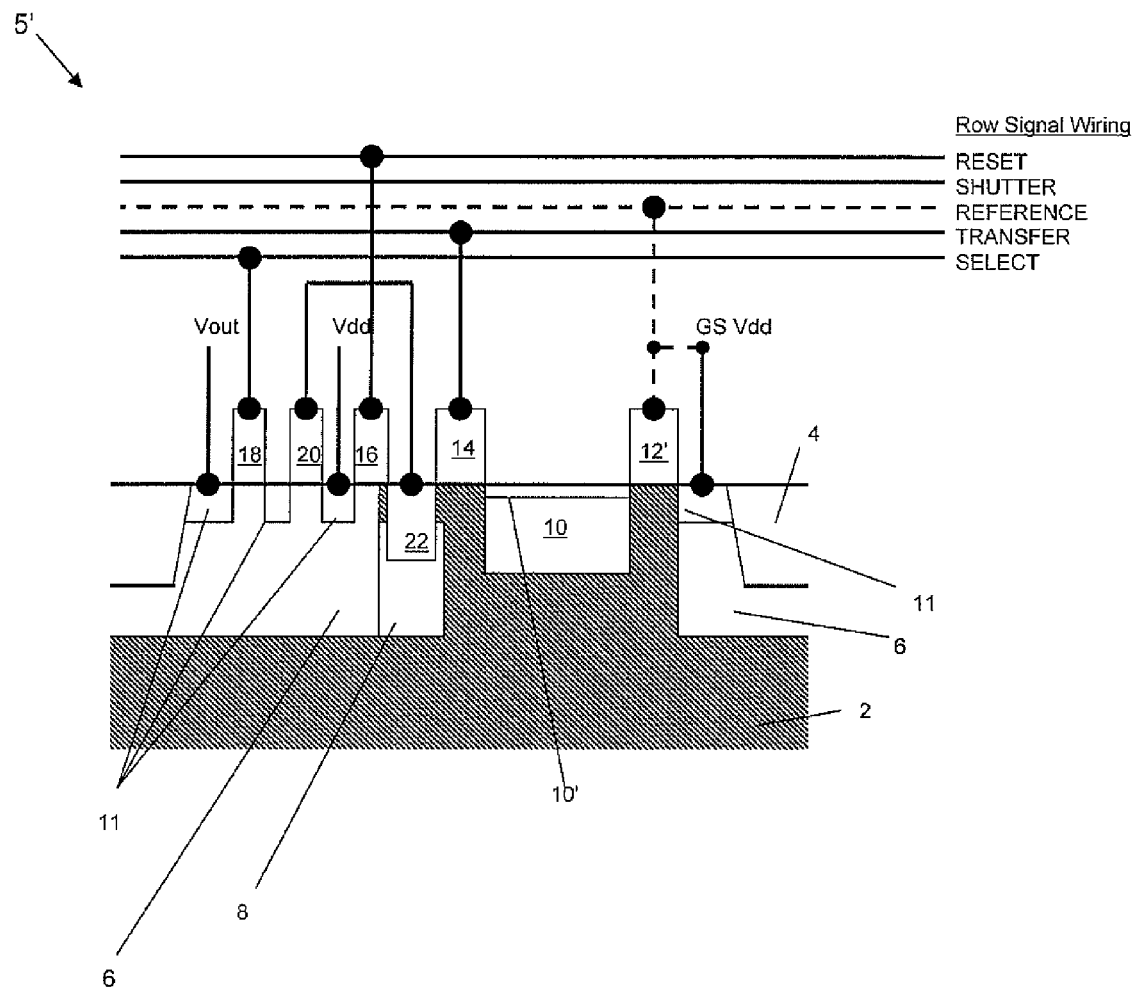
FIG. 5 is a cross-sectional view of an exemplary reference pixel sensor cell (and respective fabrication steps) in accordance with aspects of the present invention.

FIG. 4 is a top view of the reference pixel sensor cell 5' in accordance with aspects of the invention. FIG. 5 is a cross-sectional view of the reference pixel sensor cell 5' in accordance with aspects of the invention. FIGS. 4 and 5 are also representative of fabrication processes for manufacturing of the reference pixel sensor cell 5' in accordance with aspects of the invention. The active pixel sensor cell 5 is also manufactured in a similar manner to that of the reference pixel sensor cell 5' and, as such, the discussion of the reference pixel sensor cell 5' is also applicable to the active pixel sensor cell 5, with the exception of the wiring of the global shutter gate 12.

More specifically, the fabrication processes start with an epitaxial layer 2. The epitaxial layer 2 can be, for example, a silicon material. A shallow trench isolation structure 4 is formed in the epitaxial layer 2, using conventional processes. For example, a resist is placed on the epitaxial layer 2 and exposed to light to form a pattern (openings). An etching processes (e.g., reactive ion etching) is performed in the epitaxial layer 2 to form a trench. The trench is then filled with an insulator material such as, for example, oxide. The resist can then be stripped.

A well implant 6 is formed in the epitaxial layer 2 using conventional implantation processes such as, for example, doping the epitaxial layer 2 with known dopants at known concentrations and doses. The dopants can be, for example, arsenic, boron or phosphorous, depending on the type of well, e.g., N-well or P-well. A floating diffusion shield implant 8 can also be formed using conventional processes.

The gates 12' (and gate 12), 14, 16, 18 and 20 are formed using conventional gate fabrication processes. For example, in embodiments, a gate dielectric layer can be formed on the epitaxial layer 2 using a conventional deposition process. In embodiments, the gate dielectric layer can be any combination of oxide, hafnium oxide, silicon oxide or other combination of dielectric material. A poly material is deposited on the gate dielectric layer. The poly layer and the gate dielectric layer are then patterned to form the gates 12' (gate 12), 14, 16, 18 and 20.

The photodiode 10 and photodiode surface pinning layer implant 10' can be formed using conventional processes. The source and drain regions 11 are formed on the sides of the gates 12', 14, 16, 18 and 20 using conventional doping/implantation processes. In embodiments, the floating diffusion 22 is also formed using conventional doping/implantation processes.

In further embodiments, wirings are formed using conventional wiring processes. For example, a dielectric layer can be deposited and patterned to form openings for contacts, e.g., tungsten. Metal can then be formed using conventional processes to form upper wiring layers. The metal can be, for example, copper. The wiring for the global shutter gate 12' can be connected to Vdd or a reference signal. In embodiments, the global shutter gate 12, for the active pixel sensor cell 5, can be connected to the "SHUTTER" row signal wiring.

Figure 6:
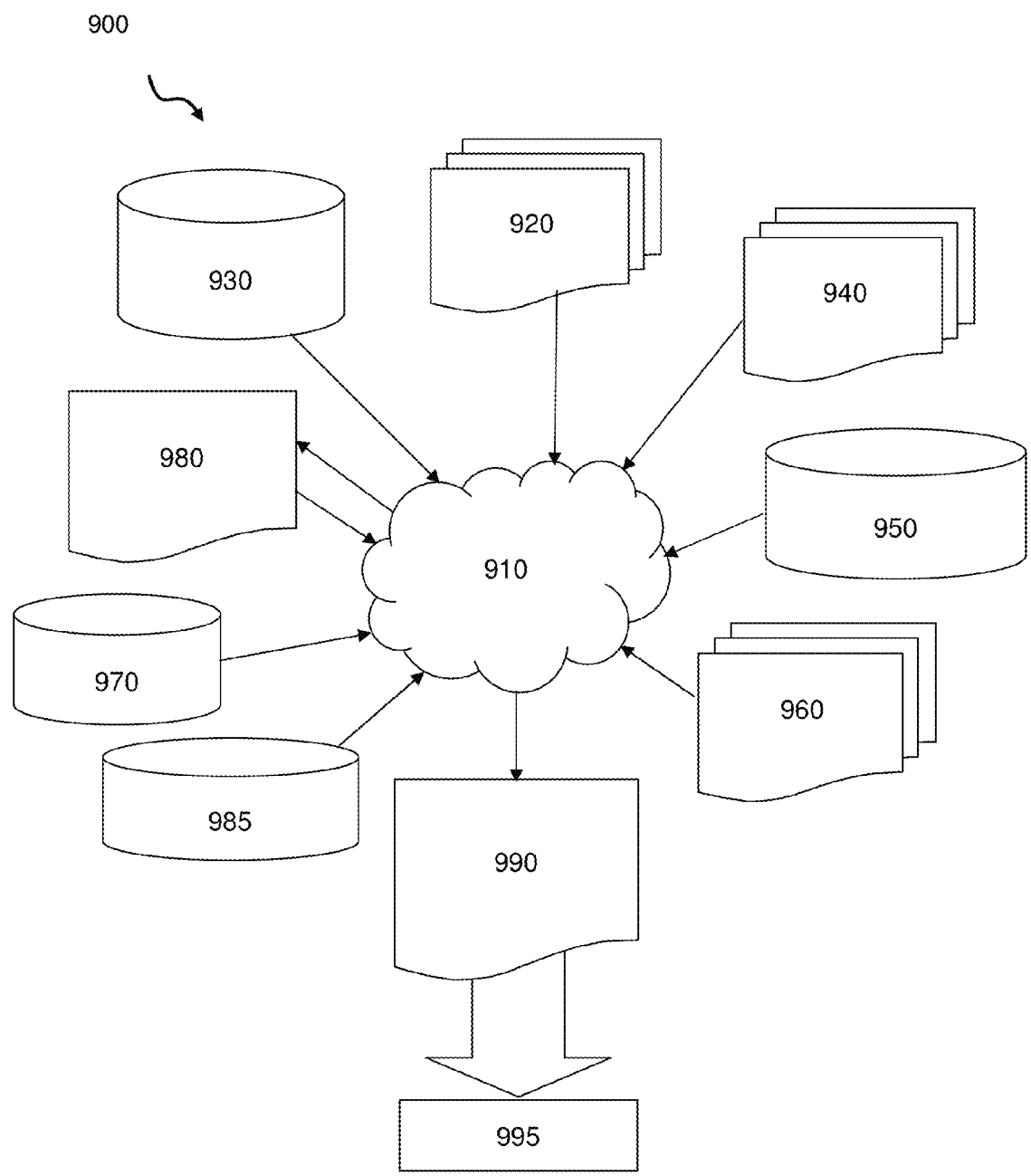
FIG. 6 is a flow diagram of a design process used in semiconductor design, manufacture, and/or test.

FIG. 6 is a flow diagram of a design process used in semiconductor design, manufacture, and/or test. FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 990 may comprise a compiled, executable HDL simulation model that functionally simulates the devices shown in FIGS. 1-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from digital cameras, toys and other low-end applications to advanced computer products.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A pixel array comprising one or more reference pixel sensor cells dispersed locally throughout active light sensing regions, the one or more reference pixel sensor cells comprising a global shutter connected to a reference signal to hold the one or more reference pixel sensor cells at a predetermined voltage level during sensor operation such that a reference voltage on a floating node remains at a set value and is used to correct for photon generated leakage signals which vary by locality within the active light sensing regions.

2. The pixel array of claim 1, wherein the one or more reference pixel sensor cells is continuously held in a reset mode so as to not be influenced by photons entering a photodiode of the one or more reference pixel sensor cells.

3. The pixel array of claim 1, wherein the one or more reference pixel sensor cells provides a known reference signal.

4. The pixel array of claim 1, wherein the one or more reference pixel sensor cells is locally positioned near a respective active pixel sensor cell in the active light sensing regions.

5. The pixel array of claim 4, wherein the one or more reference pixel sensor cells is surrounded by a plurality of active pixel sensor cells.

6. The pixel array of claim 4, wherein the one or more reference pixel sensor cells is adjacent to one or more active pixel sensor cells.

7. The pixel array of claim 6, wherein the one or more reference pixel sensor cells is a paired unit cell with the one or more active pixel sensor cells.

8. The pixel array of claim 4, wherein the one or more reference pixel sensor cells account for about 25% or more of pixels in the pixel array.

9. The pixel array of claim 1, wherein the one or more reference pixel sensor cells has substantially same signal characteristics of an active pixel sensor cell.

10. The pixel array of claim 1, wherein the global shutter gate is connected to signal wiring such that a photodiode is held at a predetermined level by wiring the global shutter gate high at the set value.

11. The pixel array of claim 1, wherein the floating diffusion node of the one or more reference pixel sensor cells remains at the set value.

12. The pixel array of claim 11, wherein a global shutter gate Vdd signal of the one or more reference pixel sensor cells is varied to reset at different levels.

13. The pixel array of claim 1, wherein the one or more reference pixel sensor cells is continuously held in a non-active mode such that a photodiode is kept out of an active state so that the one or more reference pixel sensor cells will not be influenced by photons entering the photodiode.

14. The pixel array of claim 1, further comprising:
a row signal wiring comprises reference row signal wiring, transfer row signal wiring, reset row signal wiring and select row signal wiring;
a pinned photodiode connected between the global shutter gate and a global transfer gate, the global shutter gate being connected to either vdd or the reference row signal wiring such that an only contribution to a signal in the one or more reference pixel sensor cells is parasitic signals of a floating diffusion hold time, regardless of a method of pixel array read-out;
the global transfer gate connected to the transfer row signal wiring;

a reset gate connected to the reset row signal wiring;
a row select gate connected to the select row signal wiring; and
a source fill gate connected to the floating node.

15. A pixel array comprising a reference pixel sensor cell comprising:
a global shutter gate which is connected to Vdd or a reference voltage line so as to continuously be held in a reset mode so as to not be influenced by photons entering a photodiode of the reference pixel sensor cell;
a row signal wiring comprising the reference voltage line, a transfer row signal wiring, a reset row signal wiring and a select row signal wiring;
a pinned photodiode connected between the global shutter gate and a global transfer gate, the global shutter gate being connected to either Vdd or the reference row signal wiring such that an only contribution to a signal in the reference pixel sensor cell is parasitic signals of a floating diffusion hold time, regardless of a method of pixel array read-out;
the global transfer gate connected to the transfer row signal wiring;
a reset gate connected to the reset row signal wiring;
a row select gate connected to the select row signal wiring; and
a source fill gate connected to a floating diffusion node.

16. The pixel array of claim 15, wherein the reference pixel sensor cell is adjacent to an active pixel sensor cell.

17. A method of manufacturing a pixel sensor cell array, comprising:
forming an active pixel sensor cell with a global shutter gate connecting to a shutter wiring line;
forming a reference pixel sensor cell in proximity to the active pixel sensor cell, the reference pixel sensor cell having a global shutter gate connected to a reference voltage such that it is not influenced by photons entering a photodiode of the reference pixel sensor cell; and
holding the reference pixel sensor cells at a predetermined voltage level during sensor operation such that the reference voltage on a floating node remains at a set value and is used to correct for photon generated leakage signals which vary by locality within an active light sensing regions.

18. A hardware description language (HDL) design structure embodied in one of a memory, a non-volatile storage medium, cache memory, or buffer space, the HDL design structure comprising elements that when processed in a computer-aided design system, which generates a machine-executable representation of a reference pixel sensor cell, wherein the HDL design structure comprises one or more reference pixel sensor cells dispersed locally throughout active light sensing regions, the one or more reference pixel sensor cells comprising a global shutter connected to a reference signal to hold the one or more reference pixel sensor cells at a predetermined voltage level during sensor operation such that a reference voltage on a floating node remains at a set value and is used to correct for photon generated leakage signals which vary by locality within the active light sensing regions.

19. The design structure of claim 18, wherein the design structure comprises a netlist.

20. The design structure of claim 18, wherein the design structure resides on storage medium as a data format used for the exchange of layout data of integrated circuits.

21. The design structure of claim 18, wherein the design structure resides in a programmable gate array.

* * * * *